(12) United States Patent
Oh et al.

(10) Patent No.: US 12,176,357 B2
(45) Date of Patent: Dec. 24, 2024

(54) ORGANIC LIGHT EMITTING DISPLAY DEVICE AND MANUFACTURING METHOD THEREOF

(71) Applicant: LG DISPLAY CO., LTD., Seoul (KR)

(72) Inventors: Jae Young Oh, Goyang-si (KR); Heechul Woo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 550 days.

(21) Appl. No.: 17/539,613

(22) Filed: Dec. 1, 2021

(65) Prior Publication Data
US 2022/0208903 A1     Jun. 30, 2022

(30) Foreign Application Priority Data
Dec. 30, 2020 (KR) .......................... 10-2020-0188251

(51) Int. Cl.
*H01L 27/32*     (2006.01)
*H01L 27/12*     (2006.01)
(Continued)

(52) U.S. Cl.
CPC ...... *H01L 27/1262* (2013.01); *H01L 27/1218* (2013.01); *H10K 50/844* (2023.02);
(Continued)

(58) Field of Classification Search
CPC . H01L 27/1218; H01L 27/1262; H10K 71/00; H10K 77/10; H10K 77/111;
(Continued)

(56) References Cited

U.S. PATENT DOCUMENTS

| | | | |
|---|---|---|---|
| 2008/0045686 A1* | 2/2008 | Meagher | C08J 7/123 526/329.7 |
| 2014/0224318 A1* | 8/2014 | Komatsu | C08L 79/08 428/473.5 |

(Continued)

FOREIGN PATENT DOCUMENTS

| | | | | |
|---|---|---|---|---|
| CN | 101490607 A | * | 7/2009 | ............. C08G 73/10 |
| CN | 108997286 A | * | 12/2018 | ........... C07D 307/89 |

(Continued)

OTHER PUBLICATIONS

Machine translation, Zhang, Chinese Pat. Pub. No. CN-112071866-A, translation date: Jul. 3, 2024, Espacenet, all pages. (Year: 2024).*

(Continued)

*Primary Examiner* — Victoria K. Hall
(74) *Attorney, Agent, or Firm* — Morgan, Lewis & Bockius LLP

(57) ABSTRACT

An organic light emitting display device includes a first display area having a plurality of sub-pixel areas therein and a second display area having a plurality of sub-pixel areas and a plurality of transmissive areas therein. The organic light emitting display device includes a plastic substrate including a first portion corresponding to the first display area and a second portion corresponding to the second display area; a plurality of thin film transistors on the plastic substrate to correspond to the plurality of sub-pixel areas; and a plurality of organic light emitting elements on the plurality of thin film transistors to correspond to the plurality of sub-pixel areas, wherein the second portion includes polyimide and a ligand compound, and the first portion includes polyimide with the ligand compound absent therein.

20 Claims, 9 Drawing Sheets

(51) Int. Cl.
  H01L 51/00 (2006.01)
  H01L 51/52 (2006.01)
  H01L 51/56 (2006.01)
  H10K 50/844 (2023.01)
  H10K 59/12 (2023.01)
  H10K 59/121 (2023.01)
  H10K 59/122 (2023.01)
  H10K 59/124 (2023.01)
  H10K 71/00 (2023.01)
  H10K 77/10 (2023.01)
  H10K 85/10 (2023.01)
  H10K 59/35 (2023.01)
  H10K 59/65 (2023.01)
  H10K 59/80 (2023.01)

(52) U.S. Cl.
  CPC ..... H10K 59/1201 (2023.02); H10K 59/1213 (2023.02); H10K 59/122 (2023.02); H10K 59/124 (2023.02); H10K 71/00 (2023.02); H10K 77/10 (2023.02); H10K 85/10 (2023.02); *H10K 59/35* (2023.02); *H10K 59/65* (2023.02); *H10K 59/8731* (2023.02); *H10K 77/111* (2023.02)

(58) Field of Classification Search
  CPC .... C08G 73/10–128; C07C 209/68–78; C07D 307/89; B32B 5/147
  See application file for complete search history.

(56) References Cited

U.S. PATENT DOCUMENTS

| | | | | |
|---|---|---|---|---|
| 2014/0371365 | A1* | 12/2014 | Bae | C08G 73/1039 524/398 |
| 2015/0218317 | A1* | 8/2015 | Komatsu | C08G 73/10 528/353 |
| 2017/0212613 | A1 | 7/2017 | Hwang et al. | |
| 2018/0190917 | A1* | 7/2018 | Oh | H10K 77/111 |
| 2019/0081263 | A1 | 3/2019 | Park et al. | |
| 2019/0207136 | A1 | 7/2019 | Chen et al. | |
| 2019/0322807 | A1* | 10/2019 | Watanabe | C08G 73/1032 |
| 2021/0335924 | A1* | 10/2021 | Bai | H10K 59/40 |
| 2023/0108673 | A1* | 4/2023 | Zhang | H10K 59/65 257/40 |

FOREIGN PATENT DOCUMENTS

| | | | | | |
|---|---|---|---|---|---|
| CN | 109111365 | A | * | 1/2019 | .......... C07C 209/68 |
| CN | 110783347 | A | * | 2/2020 | ......... H01L 27/1218 |
| CN | 1117254738 | A | * | 9/2020 | ............. H10K 59/65 |
| CN | 112071866 | A | * | 12/2020 | ......... H01L 27/1218 |
| CN | 114249906 | A | * | 3/2022 | .......... C08G 73/1003 |
| KR | 10-2017-0087635 | A | | 7/2017 | |
| KR | 10-2018-0079580 | A | | 7/2018 | |
| WO | WO-2018070398 | A1 | * | 4/2018 | ............. C08G 73/10 |

OTHER PUBLICATIONS

Machine translation, Zhao, Chinese Pat. Pub. No. CN-109111365-A, translation date: Jun. 17, 2024, Espacenet, all pages. (Year: 2024).*

Machine translation, Zhao, Chinese Pat. Pub. No. CN-108997286-A, translation date: Jun. 17, 2024, Espacenet, all pages. (Year: 2024).*

Machine translation, Nakahara, WIPO Pat. Pub. No. WO-2018070398-A1, translation date: Jul. 9, 2024, Espacenet, all pages. ( Year: 2024).*

Machine translation, Satoshi, Chinese Pat. Pub. No. CN-101490607-A, translation date: Jun. 17, 2024, Espacenet, all pages. (Year : 2024).*

Machine translation, Li, Chinese Pat. Pub. No. CN-114249906-A, translation date: Jul. 3, 2024, Espacenet, all pages. (Year: 2024).*

Machine translation, Liu, Chinese Pat. Pub. No. CN-110783347-A, translation date: Jul. 3, 2024, Espacenet, all pages. (Year: 2024).*

Machine translation, Li, Chinese Pat. Pub. No. CN-1117254738-A, translation date: Jul. 9, 2024, Clarivate Analytics, all pages. (Year: 2024).*

Search Report dated Apr. 8, 2022, issued in corresponding UK Patent Application No. GB2116075.9.

* cited by examiner

ORGANIC LIGHT EMITTING DISPLAY DEVICE AND MANUFACTURING METHOD THEREOF

CROSS-REFERENCE TO RELATED APPLICATIONS

This application claims the benefit of and priority to Korean Patent Application No. 10-2020-0188251 filed on Dec. 30, 2020 in the Republic of Korea, the entire contents of which are hereby expressly incorporated by reference into the present application.

BACKGROUND

Technical Field

The present disclosure relates to an organic light emitting display device and a manufacturing method thereof, and more particularly, to an organic light emitting display device including a plastic substrate having selectively improved transmittance and a manufacturing method thereof.

Discussion of the Related Art

Recently, as our society advances toward an information-oriented society, the field of display devices for visually expressing an electrical information signal has rapidly advanced. Various display devices having excellent performance in terms of thin profile, light weight, and low power consumption are being developed correspondingly. A plastic organic light emitting display device is thin and lightweight and has excellent flexibility by use of a plastic film, instead of thick glass, as a substrate so that it can be easily applied to various forms, such as a flexible display and the like.

Meanwhile, a display device includes a display area in which an image is substantially displayed and a bezel area that is a non-display area in which an image is not substantially displayed because it is covered by a light blocking member or the like. Display elements for displaying images are disposed in the display area, and various lines or driving circuits for driving the display elements are disposed in the bezel area. A display includes a camera, a speaker, various sensors, and the like to provide various functions, and these components are also disposed in the bezel area.

Recently, studies for reducing the bezel area have been actively conducted to make a design of the display beautiful and to provide a screen as wide as possible within a limited size of the display. Correspondingly, techniques have been proposed to dispose components, such as a camera and a sensor that were previously in the bezel area, instead in the display area. For example, such components have been proposed to be disposed on a rear surface of the display so that an image can be smoothly displayed.

SUMMARY

A polyimide film, which is most widely used as a plastic substrate, has advantages in that it is not deformed even during a deposition process of a thin film transistor or the like, which is performed at a high temperature of 300° C. or higher because it has excellent mechanical strength and, in particular, excellent heat resistance.

However, polyimide has disadvantages in that it forms a charge transfer complex (CTC) by interactions within chains and between adjacent chains and exhibits significant coloration ranging from light yellow to dark brown. Here, polyimide includes amine, which is an electron donor, and a carbonyl group, which is an electron acceptor, in a main chain thereof, and it is stabilized while pushing electrons from the amine, which is the electron donor, to the carbonyl group, which is the electron acceptor, to thereby form a charge transfer complex. This occurs not only within one chain, but also between adjacent chains. A stack between the chains is caused by such an interaction, and thus, chain density is high. The transfer complex is due to transfers of $\pi$ electrons present in the polyimide, and an energy level is lowered as the $\pi$ electrons are transferred. Accordingly, there is a limitation in that visible light, particularly visible light in a wavelength band of 400 nm to 500 nm is absorbed, and light of yellow and brown colors which are complementary colors is exhibited, and transmittance is lowered.

On the other hand, when a camera or a sensor is disposed on a rear surface of a display to reduce a bezel area, an area in which the camera or the like is disposed needs to have a transmittance of a predetermined level or more for a smooth operation. Accordingly, in the case of using a polyimide film as a substrate, transmittance was ensured in a manner in which a thin film transistor and a light emitting element are formed on the polyimide film and then, polyimide in the area in which the camera is disposed is irradiated with high energy, such as a laser to remove it. However, contamination of a panel by a by-product of polyimide occurred, and there was a limitation in improving transmittance due to polyimide residues that were not completely removed. In addition, there are limitations in that the thin film transistor and a moisture barrier layer are damaged due to high energy during laser irradiation, thereby lowering the reliability of the display panel.

Accordingly, a transparent polyimide film with improved transmittance through a reduction in formation of the CTC by introducing an organic group containing an element with high electronegativity such as trifluoromethyl, sulfone, and ether into the main chain of polyimide was developed. However, the developed transparent polyimide requires complicated synthesis, which has a limitation in that a unit cost considerably increases as compared to existing colored polyimide, thereby increasing a material cost.

Accordingly, embodiments of the present disclosure are directed to an organic light emitting display device and a manufacturing method thereof that substantially obviate one or more of the problems due to limitations and disadvantages of the related art.

Accordingly, an aspect of the present disclosure is to provide an organic light emitting display device including a plastic substrate with light transmittance improved with a low-cost material and through a simple process compared to the related art, and a manufacturing method thereof.

Another aspect of the present disclosure is to provide an organic light emitting display device capable of selectively improving transmittance of a polyimide film without irradiating high energy such as a laser, and thus minimizing or reducing damage to a display panel or contamination due to polyimide residues described above, and a manufacturing method thereof.

Another aspect of the present disclosure is to selectively improve light transmittance for a specific area of a polyimide film through a simple process, and to reduce a bezel area by disposing a camera or sensor on a rear surface of polyamide film with improved transmittance.

Another aspect of the present disclosure is to selectively improve light transmittance through a simple process using an inexpensive material compared to the related art, while maintaining high reliability of the display device, and a manufacturing method thereof.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, an organic light emitting display device, including a first display area having a plurality of sub-pixel areas therein and a second display area having a plurality of sub-pixel areas and a plurality of transmissive areas therein, comprises a plastic substrate including a first portion corresponding to the first display area and a second portion corresponding to the second display area; a plurality of thin film transistors on the plastic substrate to correspond to the plurality of sub-pixel areas; and a plurality of organic light emitting elements on the plurality of thin film transistors to correspond to the plurality of sub-pixel areas, wherein the second portion includes polyimide and a ligand compound, and the first portion includes polyimide with the ligand compound absent therein.

In another aspect, a manufacturing method of an organic light emitting display device comprises providing a plastic substrate including polyimide; forming a plurality of thin film transistors on the plastic substrate; forming organic light emitting elements on the plurality of thin film transistors; and applying a ligand solution to at least a portion of a rear surface of the plastic substrate and drying the ligand solution.

Other detailed matters of the exemplary embodiments are included in the detailed description and the drawings.

According to the present disclosure, through a simple process of treating a plastic substrate including inexpensive colored polyimide with a ligand solution, without irradiating high energy such as a laser, transmittance of the plastic substrate can be selectively improved.

In addition, as the limitations of the related art laser irradiation method described above are resolved by replacing a process of irradiating high energy such as a laser, transmittance of the plastic substrate can be selectively improved while high reliability of an organic light emitting display device can be maintained.

In addition, it is possible to provide an organic light emitting display device having a reduced bezel area by selectively disposing a camera and/or various sensors on a rear surface of a plastic substrate having improved transmittance.

Furthermore, by treating the entire surface of the plastic substrate with a ligand solution, light transmittance over the entire area of an organic light emitting display device can be improved, and using this, a transparent display device can be easily implemented.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles.

DETAILED DESCRIPTION

Figure 1:
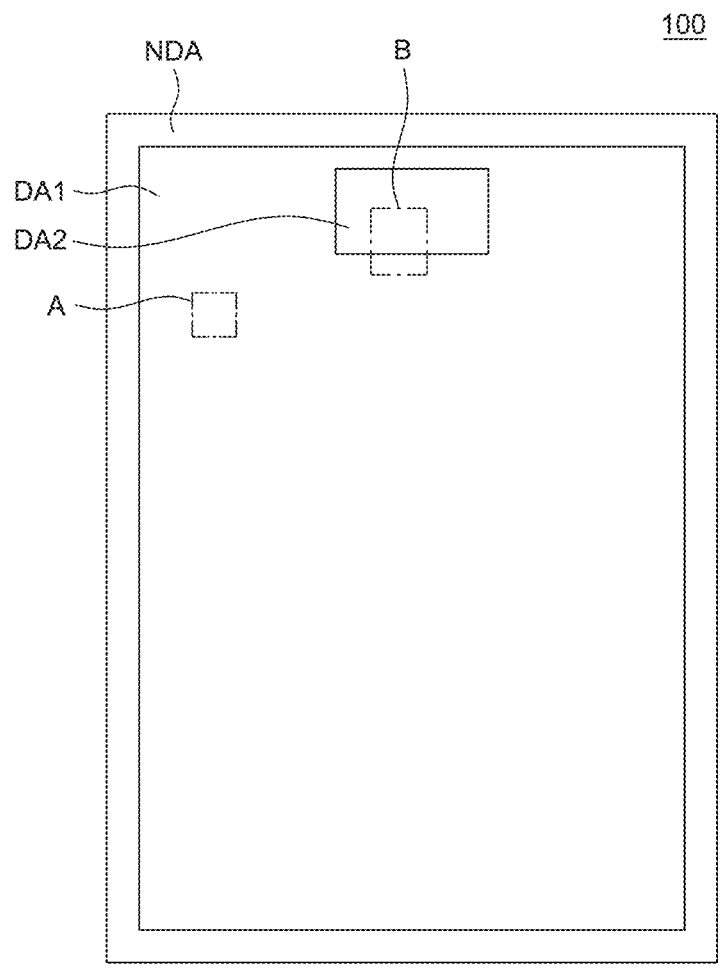
FIG. 1 is a schematic plan view of an organic light emitting display device according to an example embodiment of the present disclosure.

Advantages and characteristics of the present disclosure and a method of achieving the advantages and characteristics will be clear with reference to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including" and "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with a more limiting term, such as "immediately" or "directly."

When an element or layer is disposed "on" another element or layer, another layer or another element may be interposed directly on the other element or therebetween.

Although the terms "first," "second," and the like may used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Unless otherwise specified herein, a yellow index is a value measured using a color difference analyzer, and light transmittance is a value measured using a UV-vis spectrophotometer.

Hereinafter, an organic light emitting display device and a manufacturing method thereof according to various example embodiments of the present disclosure will be described with reference to the drawings.

Figure 2:
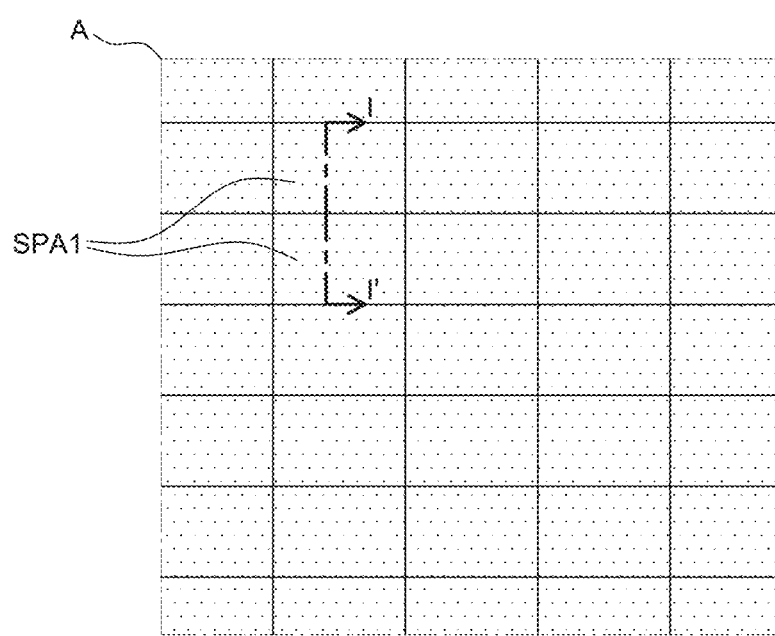
FIG. 2 is a schematic enlarged plan view of area A in FIG. 1.
Figure 3:
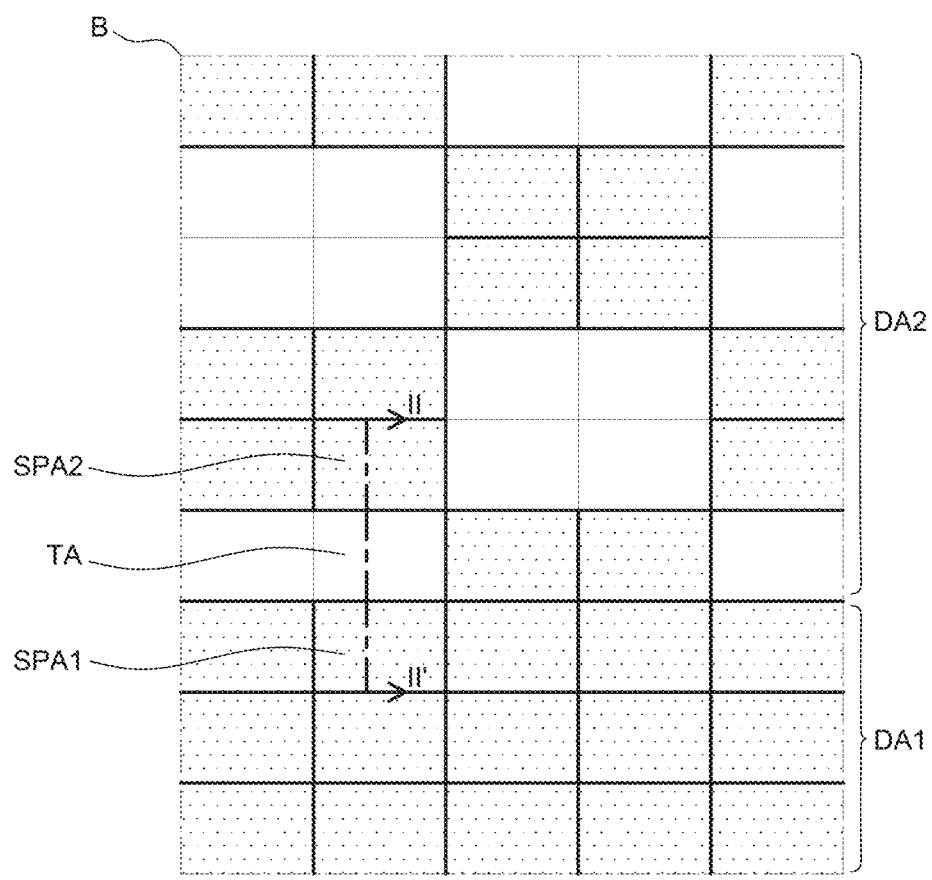
FIG. 3 is a schematic enlarged plan view of area B in FIG. 1.
Figure 4:
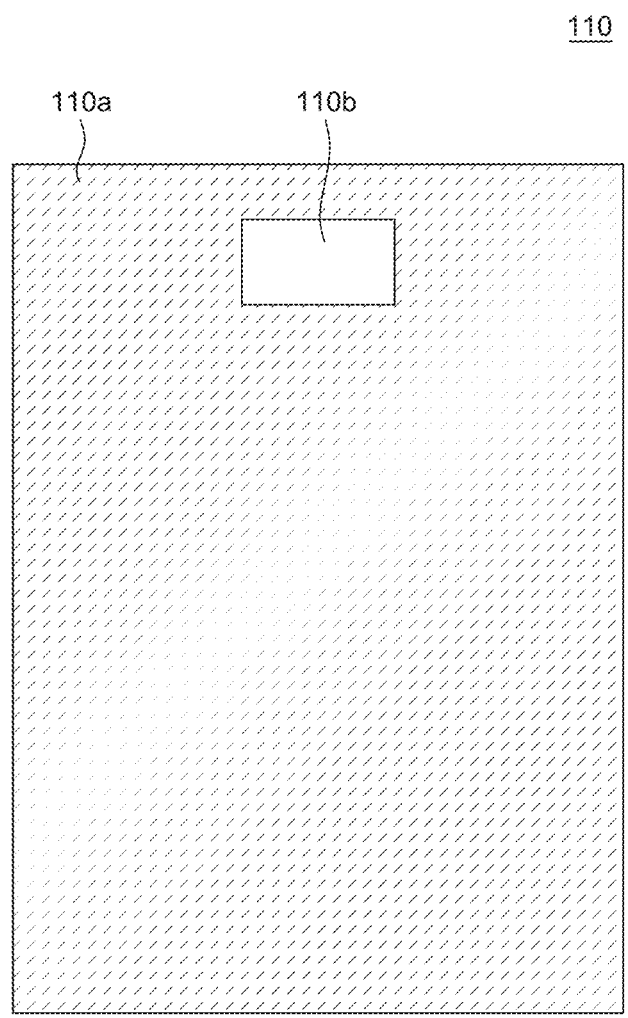
FIG. 4 is a schematic plan view of a plastic substrate in the organic light emitting display device according to an example embodiment of the present disclosure.
Figure 5:
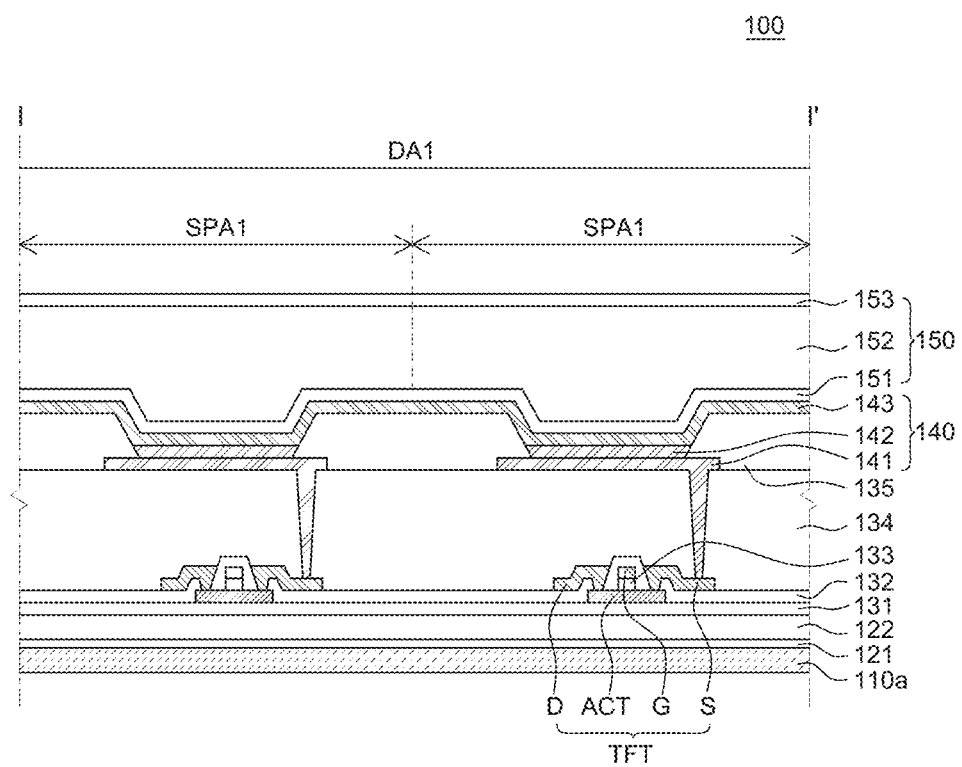
FIG. 5 is a schematic cross-sectional view taken along line I-I' in FIG. 2.
Figure 6:
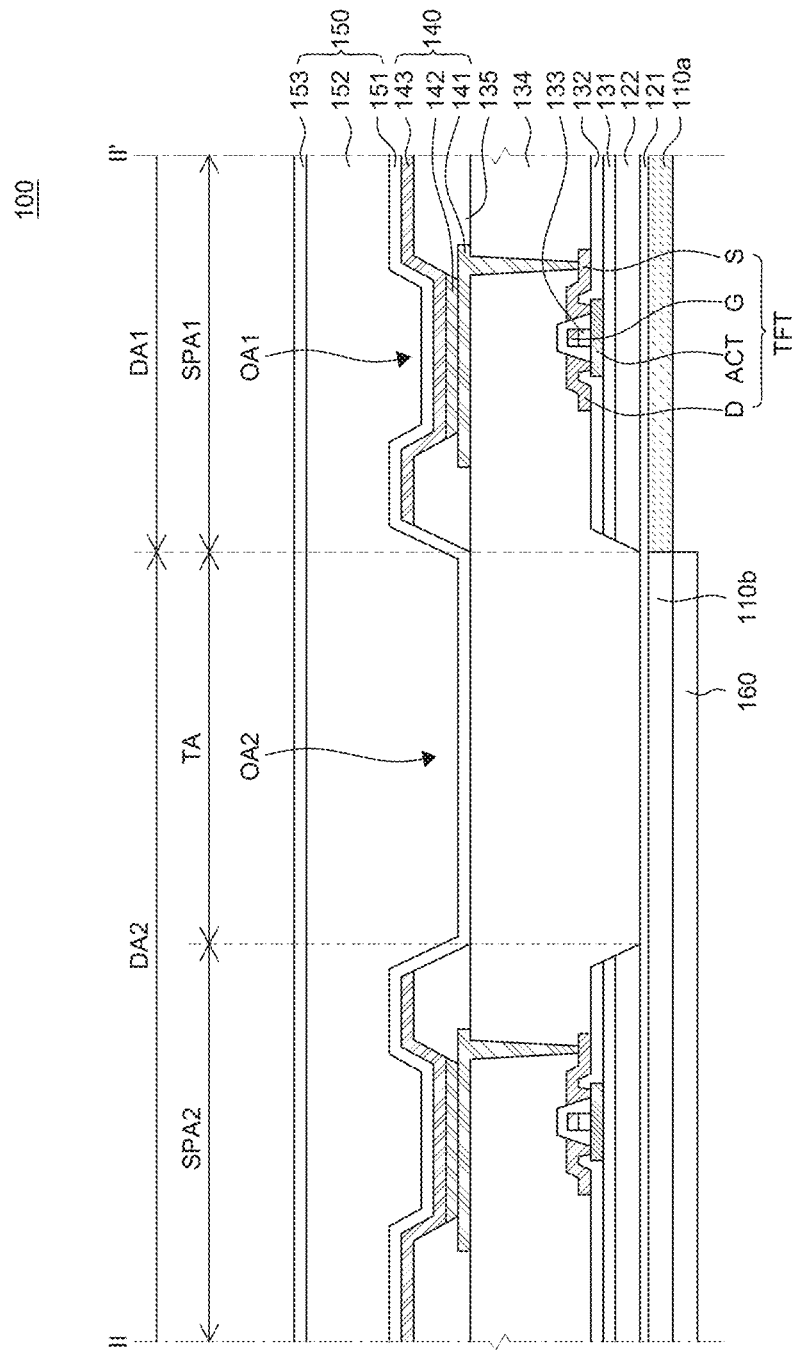
FIG. 6 is a schematic cross-sectional view taken along line II-II' in FIG. 3.

FIGS. 1 to 6 are views for explaining an organic light emitting display device according to an example embodiment of the present disclosure. FIG. 1 is a schematic plan view of an organic light emitting display device according to an example embodiment of the present disclosure. FIG. 2 is a schematic enlarged plan view of area A in FIG. 1. FIG. 3 is a schematic enlarged plan view of area B in FIG. 1. FIG. 4 is a schematic plan view of a plastic substrate in the organic light emitting display device according to an example embodiment of the present disclosure. FIG. 5 is a schematic cross-sectional view taken along line I-I' in FIG. 2. FIG. 6 is a schematic cross-sectional view taken along line II-II' in FIG. 3.

With reference to FIGS. 1 to 6, an organic light emitting display device 100 may include a plastic substrate 110, thin film transistors TFT, a planarization layer 134, banks 135, organic light emitting elements 140, an encapsulation layer 150, and a camera module 160. Hereinafter, respective components will be described in detail.

First, with reference to FIG. 1, the organic light emitting display device 100 may be divided into display areas DA1 and DA2 and a non-display area NDA. The display areas DA1 and DA2 are areas in which a plurality of sub-pixels are disposed to substantially display images. A plurality of sub-pixels for displaying images and various driving elements and driving circuits for driving the sub-pixels may be disposed in the display areas DA1 and DA2. The sub-pixel is a sub-pixel that is an element for displaying one color, and includes a light emitting area in which light is emitted and a non-emission area in which light is not emitted.

The non-display area NDA surrounds the display areas DA1 and DA2. The non-display area NDA is an area in which an image is not substantially displayed, and may be referred to as a bezel area. Various lines, driver ICs, printed circuit boards and the like for driving the sub-pixels and the driving elements disposed in the display areas DA1 and DA2 are disposed in the non-display area NDA. For example, various ICs such as a gate driver IC and a data driver IC may be disposed in the non-display area.

Also, the display areas DA1 and DA2 may be divided into a first display area DA1 and a second display area DA2. The first display area DA1 surrounds the second display area DA2. Also, an area of the second display area DA2 is smaller than an area of the first display area DA1. FIG. 1 illustrates that the second display area DA2 is positioned at a center of an upper end of the entire display area, but the present disclosure is not limited thereto. A position, shape, and size of the second display area DA2 may be changed as needed.

With reference to FIGS. 1 to 3, the first display area DA1 includes a plurality of sub-pixel areas SPA1, and the second display area DA2 includes a plurality of sub-pixel areas SPA2 and a plurality of transmissive areas TA. In the drawings, different reference numerals are used to distinguish the plurality of sub-pixel areas of the first display area and the plurality of sub-pixel areas of the second display area, but they may be substantially the same as each other. Also, it is illustrated that each of the plurality of sub-pixel areas and the plurality of transmissive areas has a rectangular shape in the drawings, but the present disclosure is not limited thereto.

The sub-pixel is formed in each of the plurality of sub-pixel areas SPA1 of the first display area DA1 and the plurality of sub-pixel areas SPA2 of the second display area DA2. Each of the sub-pixels may be any one of a red sub-pixel, a green sub-pixel, a blue sub-pixel, and a white sub-pixel. The sub-pixels are not disposed in the transmissive areas TA of the second display area DA2, and accordingly, the transmissive areas TA do not emit light and may be transparent.

The first display area DA1 and the second display area DA2 may have different resolutions. The first display area DA1 is configured to include the plurality of sub-pixel areas SPA1, and the second display area DA2 is configured to include the plurality of sub-pixels SPA2 and the plurality of transmissive areas TA. Also, comparing the first display area DA1 with the second display area DA2 based on the same area, the second display area DA2 has a smaller number of sub-pixel areas than that of the first display area DA1. For example, the number of sub-pixels included in the second display area DA2 may be smaller than the number of sub-pixels included in the first display area DA1 based on the same area, and accordingly, the resolution of the second display area DA2 may be lower than the resolution of the first display area DA1. For example, the second display area DA2 may include the plurality of transmissive areas TA so that it has a low resolution and has a higher light transmittance than the first display area DA1.

The organic light emitting display device 100 may include components such as a camera module, an infrared sensor, an illuminance sensor, an object and/or a biometric sensor to provide various functions and convenience to a user. These components may be disposed on a rear surface of the plastic substrate 110 to overlap the second display area DA2. Since the second display area DA2 includes the plurality of sub-pixel areas SPA2 and the plurality of transmissive areas TA, an image is displayed through the second display area DA2 and at the same time, the second display area DA2 has high light transmittance, so that the camera module and/or various sensors described above may be disposed therein.

According to the related art, a camera module, various sensors, and the like were disposed in the non-display area so that a reduction of the non-display area was restricted. According to an exemplary embodiment of the present disclosure, the second display area DA2 having a relatively high light transmittance may be provided so that components such as a camera module and the like may be disposed to overlap the second display area DA2. Accordingly, the non-display area NDA may decrease.

Although FIG. 1 illustrates that the display area is divided into the first display area DA1 and the second display area DA2, the present disclosure is not limited thereto. For example, when a transparent organic light emitting display device is implemented, a light transmittance of a predetermined level or more needs to be secured over the entire area of the display device. In this case, the display area may be composed of only the second display area including the plurality of sub-pixels and the plurality of transmissive areas. As another example, the display area may further include a third display area. The third display area may include a plurality of sub-pixel areas and a plurality of transmissive areas, and thus, may have a lower resolution than the first display area. The resolution of the third display area may be the same as or different from that of the second display area. When the third display area is further included, a camera module may be disposed to overlap the second display area, and another camera module or various sensors may be disposed to overlap the third display area, but the present disclosure is not limited thereto.

The plastic substrate 110 supports various elements constituting the organic light emitting display device 100. As illustrated in FIG. 4, the plastic substrate 110 may include a first portion 110a and a second portion 110b. The first portion 110a corresponds to the first display area DA1, and the second portion 110b corresponds to the second display area DA2. A detailed description thereof will be provided later.

The plastic substrate 110 includes polyimide. Polyimide has excellent mechanical properties and, in particular, excellent heat resistance, so that it does not cause thermal decomposition or thermal deformation even in a high-temperature process of forming components such as a thin film transistor and the like on a plastic substrate.

For example, polyimide may include a repeating unit represented by Formula 1 below.

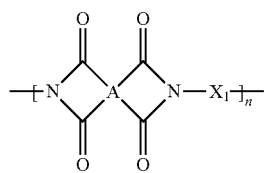

[Formula 1]

In Formula 1,

may be a tetravalent organic group, and $X_1$ may be a divalent aromatic organic group. n may be an integer from 10 to 1000, but is not limited thereto.

As described above, polyimide forms a charge transfer complex by interactions within chains and between adjacent chains. For example, as shown in Formula 1, polyimide is composed of a repeating unit including an amine acting as an electron donor and a carbonyl group acting as an electron acceptor. Accordingly, a charge transfer complex that is stabilized while pushing electrons from the amine to the carbonyl group is formed and by this interaction, a stack between the chains is caused, thereby exhibiting a characteristic of a considerably high chain density. In addition, an energy level is lowered while the charge transfer complex is stabilized by such charge transfer, so the charge transfer complex absorbs visible light in a wavelength range of 400 nm to 500 nm and exhibits coloration ranging from light yellow to dark brown. Polyimide that exhibits a characteristic color due to formation of the charge transfer complex as described above is commonly referred to as colored polyimide. Colored polyimide has limited use due to a unique color thereof when it is required to have high transmittance. To secure transmittance, a transparent polyimide film may be used, but this is a considerably more expensive material compared to colored polyimide, thereby significantly increasing material cost.

According to the present disclosure transmittance of the plastic substrate 110 can be selectively improved. Accordingly, in consideration of a reduction in material cost, it may be advantageous to use colored polyimide as the plastic substrate 110. The colored polyimide may be a polyimide having a light transmittance (450 nm) of 40% or less, which can be distinguished from a transparent polyimide having a light transmittance (450 nm) of 60% or more. As another example, the colored polyimide may be a polyimide having a yellow index of 90 or more, and may be distinguished from a transparent polyimide having a yellow index of 20 or less.

As a specific example, polyimide includes a repeating unit represented by Formula 1, wherein

is an organic group represented by Formula 2a or 2b, and X1 may be an organic group represented by Formula 3a or 3b, but the present disclosure is not limited thereto.

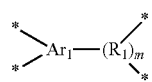

[Formula 2a]

In Formula 2a, An may be a cycloalkyl group having 4 to 10 carbon atoms or an aryl group having 6 to 12 carbon atoms, $R_1$ may be an alkyl group having 1 to 10 carbon atoms, and m may be 0 or 2.

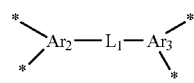

[Formula 2b]

In Formula 2b, $Ar_2$ and $Ar_3$ may each independently be an aryl group having 6 to 12 carbon atoms or an aryloxy group having 6 to 12 carbon atoms, and $L_1$ may be selected from among a single bond, —O—, —S—, —C($R_2$)($R_3$)—, —C(=O)—, —C(=O)O—, —C(=O)NH— and a phenyl group, wherein $R_2$ and $R_3$ may be each independently selected from hydrogen and an alkyl group having 1 to 10 carbon atoms.

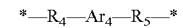  [Formula 3a]

In Formula 3a, Ara may be an aryl group having 6 to 12 carbon atoms, and $R_4$ and $R_5$ may each independently be an alkyl group having 1 to 10 carbon atoms.

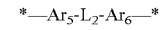  [Formula 3b]

In Formula 3b, $Ar_5$ and $Ar_6$ may each independently be an aryl group having 6 to 12 carbon atoms or an aryloxy group having 6 to 12 carbon atoms, and $L_2$ may be selected from among a single bond, —O—, —S—, —C($R_2$)($R_3$)—, —C(=O)—, —C(=O)O—, —C(=O)NH—, and a phenyl group.

In the case of the organic light emitting display device 100 according to an exemplary embodiment of the present disclosure, a component, such as the camera module 160 or the like, is disposed to overlap the second display area DA2. Accordingly, the second display area DA2 has a transmittance of a predetermined level or higher. However, when the above colored polyimide is used as the plastic substrate 110, there is a defect in that transmittance is lowered in the second display area.

With reference to FIGS. 4 to 6, in the organic light emitting display device 100 of the present disclosure, the plastic substrate 110 includes the first portion 110*a* and the second portion 110*b* that have different light transmittances. As described above, the first portion 110*a* corresponds to the first display area DA1, and the second portion 110*b* corresponds to the second display area DA2. The first portion 110*a* and the second portion 110*b* are integrally formed by including the same polyimide. In this case, the second portion 110*b* that is required to have a transmittance of a predetermined level or further includes a ligand compound. The ligand compound penetrates between chains of the polyimide and widen a distance between the chains, thereby preventing formation of a charge transfer complex between the chains. Accordingly, the second portion 110*b* further including the ligand compound has a higher transmittance than the first portion 110*a*.

The second portion 110*b* inhibits the formation of a charge transfer complex by including the ligand compound, and thus exhibits different physical properties from those of the first portion 110*a* even though they are integrally formed with the same polyimide. For example, a yellow index of the second portion 110*b* is lower than a yellow index of the first portion 110*a*. In addition, light transmittance of the second portion 110*b* in a wavelength band of 400 nm to 500 nm is higher than light transmittance of the first portion 110*a* in the wavelength band of 400 nm to 500 nm. As described above, in the second portion 110*b*, a change in energy level is minimized or reduced as the ligand compound penetrates into the polyimide chain and the formation of the charge transfer complex is inhibited. Accordingly, the light transmittance of the second portion 110*b* is higher than that of the first portion 110*a* in the wavelength band of 400 nm to 500 nm, which is visible light absorbed when the charge transfer complex is formed. In addition, as absorption of visible light in the wavelength band is reduced, the second portion 110*b* has a lower yellow index and higher light transmittance compared to the first portion 110*a*. For example, the light transmittance (450 nm) of the first portion 110*a* may be 40% or less, and the light transmittance (450 nm) of the second portion 110*b* may be 50% or more. Although the first portion 110*a* and the second portion 110*b* are integrally formed of the same polyimide, the second portion 110*b* may be selectively treated with a ligand solution to thereby achieve a higher light transmittance characteristic of the second portion 110*b*. By including the plastic substrate 110 having the above characteristics, the transmittance of the second display area DA2 of the organic light emitting display device 100 may be improved. Meanwhile, when a transparent area is selectively formed by patterning using colored polyimide and transparent polyimide, respectively, even if the colored polyimide and transparent polyimide are patterned at the same thickness, a step is generated and flatness is inevitably reduced. In an example embodiment of the present disclosure, the plastic substrate in which the first portion 110*a* and the second portion 110*b* are integrally formed has an advantage of excellent flatness.

The second portion of the plastic substrate may be modified as required. For example, when a transparent organic light emitting display device is implemented, it is required to secure high transmittance over the entire display area. Accordingly, the plastic substrate is not divided into a first portion and a second portion, and the entire area thereof may include polyamide and a ligand compound. The second portion may be variously changed to correspond to at least a part or the entire area of the display device that is required to secure a transmittance of a predetermined level or higher.

Figure 7A:
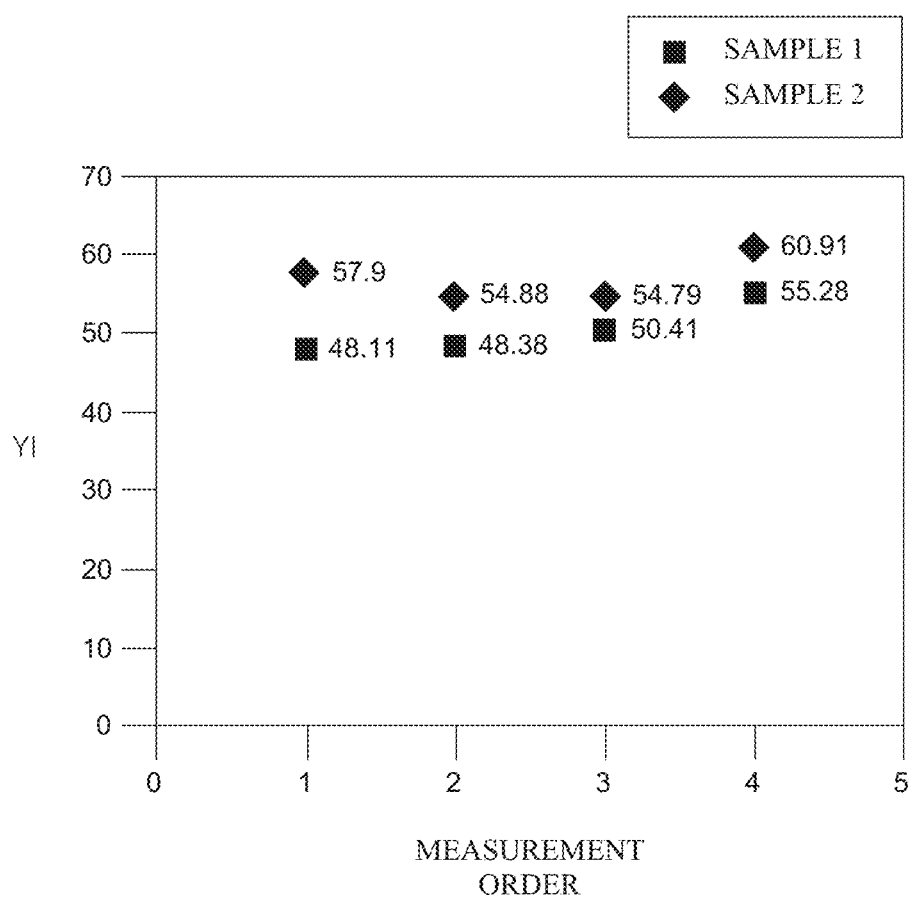
FIG. 7A is a graph showing yellow indices (YI) of a colored polyimide film according to presence or absence of treatment with a ligand solution.
Figure 7B:
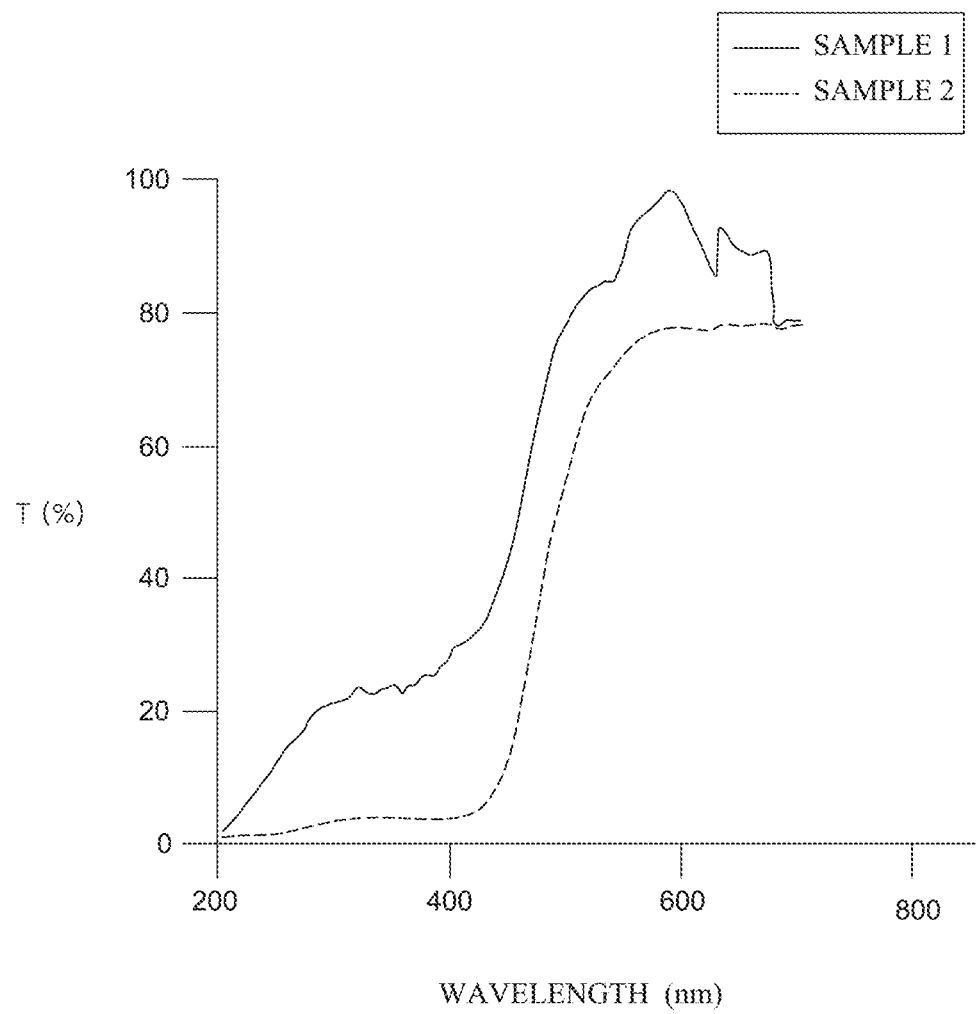
FIG. 7B is a graph showing light transmittance of the colored polyimide film according to presence or absence of treatment with the ligand solution.

FIG. 7A is a graph showing yellow indices (YI) of a colored polyimide film according to presence or absence of treatment with a ligand solution. FIG. 7B is a graph showing light transmittance of the colored polyimide film according to presence or absence of treatment with the ligand solution. Here, two colored polyimide films were prepared, one was immersed in a ligand solution prepared by dissolving oleic amine which is a ligand compound in dimethylformamide, for a predetermined period of time to thereby prepare Sample 1, and the other was immersed in dimethylformamide for the same period of time to thereby prepare Sample 2.

A yellow index was measured 5 times for each sample. FIG. 7A is a graph showing yellow index values by respective measurement orders of Samples 1 and 2. As a result of yellow index measurement, it can be confirmed that an average yellow index value of Sample 1 was 50.5 and an average yellow index value of Sample 2 was 57.1, which indicates that the yellow index (YI) value of Sample 1 prepared by being immersed in the ligand solution is lower than that of Sample 2. In addition, as illustrated in FIG. 7B, it can be confirmed that the light transmittance of Sample 1 was significantly improved compared to Sample 2 in a range of 400 nm to 500 nm, which is an absorption wavelength of a charge transfer complex. In addition, it can be confirmed that Sample 1 treated with the ligand solution exhibited higher transmittance than Sample 2 over an entire visible light area (400 nm to 700 nm), thereby exhibiting excellent transparency.

From results shown in FIGS. 7A and 7B, it can be confirmed that formation of a charge transfer complex between polyimide chains was inhibited by the ligand compound, and thus, the transmittance of the polyimide can be improved. Although not attached to the drawings, it was confirmed that the light transmittance of Sample 1 over the entire visible light area was 86.1%. This is a level corresponding to a transparent polyimide film according to the related art, and according to the present disclosure, optical properties comparable to those of transparent polyimide can be achieved using colored polyimide.

The ligand compound may be a material that does not absorb visible light. In particular, a material that does not absorb light in a wavelength range of 400 nm to 500 nm may be used as the ligand compound. As described above, polyimide absorbs visible light in the wavelength range of 400 nm to 500 nm due to formation of a charge transfer complex, thereby leading to a reduction in transmittance, a ligand compound that does not absorb light in this wavelength band may be used. For example, the ligand compound may have a light transmittance of 90% or more in the wavelength range of 400 nm to 500 nm.

For example, the ligand compound may be at least one selected from an amine-based compound and a carboxylic acid-based compound. For example, the amine-based compound may be an amine having an alkyl group having 3 to 20 carbon atoms. In this case, the alkyl group may include at least one unsaturated bond. For example, the carboxylic acid-based compound may be a carboxylic acid having an alkyl group having 3 to 20 carbon atoms. In this case, the alkyl group may include at least one unsaturated bond. In the present disclosure, the carboxylic acid-based compound includes an esterified product of carboxylic acid or a derivative of carboxylic acid such as carboxylic acid anhydride.

The amine-based compound may act as an electron donor, and the carboxylic acid-based compound may act as an electron acceptor. Accordingly, when an amine compound and/or a carboxylic acid compound are used as the ligand compound, they interact with polyimide chains and may inhibit charge transfers between adjacent polyimide chains. This reduces formation of charge transfer complexes between polyimide chains.

For example, the ligand compound may be an amine or a carboxylic acid having an alkyl group having 15 to 20 carbon atoms. In this case, when the ligand compound penetrates into the chains of the polyimide, a distance between the polyimide chains further increases, making it more difficult to transfer charges between the chains. Accordingly, the formation of the charge transfer complex is further inhibited, and the optical properties of the second portion 110*b* may be further improved.

According to the related art, transmittance was secured by irradiating a high-energy laser to an area of a plastic substrate corresponding to the second display area to remove polyimide in the corresponding area, or using a transparent polyimide film as the plastic substrate. However, as described above, the laser irradiation method requires expensive laser equipment and had a limitation in improving transmittance due to contamination by by-products generated in a laser irradiation process and polyimide residues. In addition, damage to a display panel by a laser occurred, which leads to difficulties in maintaining display quality and reliability of the display device. In addition, transparent polyimide is a considerably more expensive material compared to colored polyimide, and has a limitation in that a material cost is greatly increased.

The plastic substrate 110 according to an exemplary embodiment of the present disclosure allows for selective improvements in transmittance by treating a portion thereof corresponding to the second display area DA2 with a ligand solution, so that display quality and reliability even with the use of a low-cost material can be kept high.

As illustrated in FIGS. 5 and 6, a barrier layer 121 is disposed on the plastic substrate 110. The barrier layer 121 may prevent deterioration due to moisture penetrating from a lower portion of the organic light emitting display device 100 by reinforcing moisture permeability resistance and oxygen resistance of the plastic substrate 110. For example, the barrier layer 121 may be formed by depositing an inorganic material such as silicon nitride ($SiN_x$), silicon oxide ($SiO_x$), silicon oxynitride (SiON), aluminum oxide ($Al_xO_y$), or amorphous silicon (α-Si), but is not limited thereto. The barrier layer 121 is substantially transparent as it is formed as a very thin film through a deposition process. Accordingly, even when the barrier layer 121 is formed on the entire surface of the plastic substrate 110, transmittance may not be significantly reduced.

An auxiliary base layer 122 is disposed on the barrier layer 121. In the case of using the plastic substrate 110 instead of a glass substrate, rigidity thereof is relatively lower than that of glass. Thus, in forming an element such as the thin film transistor TFT or the like, it is difficult to control a process, and deformation such as sagging may occur. The auxiliary substrate layer 122 reinforces the rigidity of the plastic substrate 110. For example, the auxiliary base layer 122 may include polyimide, polycarbonate, polyether sulfone, or the like. For example, the auxiliary base layer 122 may be formed of polyimide having excellent rigidity and heat resistance.

The auxiliary base layer 122 may be formed on the barrier layer 121 to correspond to the plurality of sub-pixel areas SPA1 and SPA2. Here, the auxiliary base layer 122 may not be formed in the transmissive area TA. When the auxiliary base layer 122 is formed on the barrier layer 121 corresponding to the transmissive area TA, the transmittance of the second display area DA2 may decrease. However, it is not limited thereto. When a material having high transparency is used as the auxiliary base layer 122, the auxiliary base layer 122 may be disposed on the entire surface of the barrier layer 121.

The thin film transistors TFT are disposed on the auxiliary base layer 122 to correspond to the plurality of sub-pixel areas SPA1 and SPA2. The thin film transistors TFT are components for driving the sub-pixels formed in the plurality of respective sub-pixel areas SPA1 and SPA2. Accordingly, the thin film transistor TFT corresponds to each of the plurality of sub-pixel areas SPA1 of the first display area DA1 and the plurality of sub-pixel areas SPA2 of the second display area DA2. In the drawings, only a driving thin film transistor is illustrated for convenience of description, but the present disclosure is not limited thereto and may further include a switching thin film transistor or the like.

A buffer layer 131 may be disposed between the auxiliary base layer 122 and the thin film transistor TFT. The buffer layer 131 prevents penetration of oxygen or moisture from the outside, and blocks impurities remaining on the plastic substrate 110 from flowing into the element. Although it is illustrated that the buffer layer 131 is formed to correspond to the plurality of sub-pixel areas in the drawings, the present disclosure is not limited thereto. When the buffer layer 131 does not reduce the transmittance of the transmissive area TA, the buffer layer 131 may also be formed in the transmissive area TA. In addition, the buffer layer 131 may be omitted if there is no influence of external air such as moisture or impurities, and may be formed of a plurality of layers if necessary.

The thin film transistor TFT that includes a gate electrode G, an active layer ACT, a source electrode S, and a drain electrode D is disposed on the buffer layer 131. For example, the active layer ACT is formed on the buffer layer 131, and a gate insulating layer 133 for insulating the gate electrode G is formed on the active layer ACT. In addition, an interlayer insulating layer 132 for insulating the gate electrode G and the source electrode S and the drain electrode D is formed, and the source electrode S and the drain electrode D that are respectively in contact with the active layer ACT are formed on the active layer ACT. However, it is not limited thereto. A configuration and arrangement of the thin film transistor TFT may be changed as necessary.

The planarization layer 134 is disposed on the thin film transistors TFT. The planarization layer 134 planarizes upper portions of the thin film transistors TFT. In addition, the planarization layer 134 covers a step between an area in which the thin film transistor TFT is disposed and an area in which the thin film transistor TFT is not disposed. For example, the planarization layer 134 is formed on the entire surface to correspond to the plurality of sub-pixel areas SPA1 and SPA2 and the plurality of transmissive areas TA. Because the auxiliary base layer 122, the buffer layer 131, and the thin film transistor TFT are not disposed in the transmissive area TA, the planarization layer 134 directly contacts the barrier layer 121 in the transmissive area TA. For example, the planarization layer 134 may be formed of a transparent insulating resin. The planarization layer 134 includes a contact hole for electrically connecting the thin film transistor TFT and the organic light emitting element 140.

The organic light emitting elements 140 are disposed on the planarization layer 134. The organic light emitting elements 140 are disposed on the planarization layer 134 to correspond to the plurality of sub-pixel areas SPA1 and SPA2 so as to be electrically connected to the thin film transistors TFT. The organic light emitting elements 140 include anodes 141, organic light emitting layers 142, and a cathode 143.

The anodes 141 are disposed on the planarization layer 134. The anodes 141 are disposed on the planarization layer 134 to correspond to the plurality of sub-pixel areas SPA1 and SPA2. In addition, the anodes 141 may be formed to be separated from each other in the plurality of sub-pixels. For example, the anode 141 may be disposed to overlap at least a portion of each of the plurality of sub-pixel areas SPA1 and SPA2. In this case, color mixing of light emitted from the sub-pixel areas SPA1 and SPA2 adjacent to each other may be prevented.

The anode 141 may be formed of a material having a high work function to supply holes to the organic light emitting layer 142. For example, the anode 141 may be formed of a transparent conductive material such as indium tin oxide (ITO), indium zinc oxide (IZO), or indium tin zinc oxide (ITZO), but is not limited thereto. Although the anode 141 is formed of a transparent conductive material, as shown in the transmissive area TA in the drawings, when the organic light emitting display device 100 is driven in a top emission method, the anode 141 may be configured to further include a reflective layer.

The anode 141 is electrically connected to the thin film transistor TFT through a contact hole of the planarization layer 134. For example, the anode 141 may be electrically connected to the source electrode S of the thin film transistor TFT, but is not limited thereto.

The cathode 143 is disposed on the anode 141. The cathode 143 supplies electrons to the organic light emitting layer 142. For example, the cathode 143 may be formed of transparent conductive materials such as indium tin oxide (ITO), indium zinc oxide (IZO), indium tin zinc oxide (ITZO), zinc oxide (ZnO), and tin oxide (TO), or a metallic material including calcium (Ca), barium (Ba), aluminum (Al), silver (Ag), magnesium (Mg), ytterbium (Yb), or the like, but is not limited thereto.

The cathode 143 may be formed to correspond to the plurality of sub-pixel areas SPA1 and SPA2. The cathode 143 may be formed connectively without being separated in the plurality of sub-pixels. In addition, although it is illustrated that the cathode 143 is not formed in the transmissive area TA in the drawings, the present disclosure is not limited thereto. When the cathode 143 is formed of a transparent material and does not reduce transmittance, the cathode 143 may be formed as a single layer over the plurality of sub-pixel areas SPA1 and SPA2 and the plurality of transmissive areas TA for convenience of a process.

The organic light emitting layers 142 are disposed between the anodes 141 and the cathode 143. The organic light emitting layer 142 is configured to emit light having the same color as that of the sub-pixel corresponding thereto. The organic light emitting layers 142 may be separated in the plurality of respective sub-pixels and disposed on the anodes 141.

The bank 135 is disposed on the anode 141 and the planarization layer 134. The bank 135 serves to distinguish adjacent sub-pixels. Also, the bank 135 serves to separate the adjacent sub-pixel areas SPA1 and SPA2 and the transmissive area TA. The bank 135 includes a plurality of open portions exposing at least portions of the planarization layer 134. For example, the bank 135 includes a plurality of first open portions OA1 and a plurality of second open portions OA2.

Each of the first open portions OA1 is formed to overlap at least a portion of each of the plurality of sub-pixel areas SPA1 and SPA2. Each of the plurality of organic light emitting elements 140 is disposed on the planarization layer 134 exposed by the first open portion OA1. Accordingly, the sub-pixels adjacent to each other are divided by the bank 135.

Each of the second open portions OA2 is formed to overlap at least a portion of each of the plurality of transmissive areas TA. Accordingly, the transmittance of the transmissive area TA may be maintained high without being reduced. However, it is not limited thereto. When the bank 135 is formed of a transparent resin and does not reduce the transmittance of the transmissive area TA, the second open portion OA2 may not be formed.

The encapsulation layer 150 is disposed on the organic light emitting elements 140. The encapsulation layer 150 protects the organic light emitting elements 140 from being deteriorated by moisture and the like, penetrating from the outside. Also, the encapsulation layer 150 planarizes upper portions of the organic light emitting elements 140. In addition, the encapsulation layer 150 covers a step between an area in which the organic light emitting element 140 is disposed and an area in which the organic light emitting element 140 is not disposed. The encapsulation layer 150 may be formed of a single layer or a plurality of layers. For example, the encapsulation layer 150 may include a first inorganic encapsulation layer 151, an organic encapsulation layer 152, and a second inorganic encapsulation layer 153. In the sub-pixel areas SPA1 and SPA2, the first inorganic encapsulation layer 151 directly contacts upper portions of the cathode 143, and in the transmissive area TA, the first inorganic encapsulation layer 151 is formed on the planarization layer 134 that is exposed by the second open portion OA2, to be in direct contact therewith. The organic encapsulation layer 152 is disposed to planarize an upper portion of the first inorganic encapsulation layer 151, and the second inorganic encapsulation layer 153 is deposited on the organic encapsulation layer 152. For example, the first inorganic encapsulation layer 151 and the second inorganic encapsulation layer 153 may be each independently formed by depositing a material selected from silicon nitride (SiNx), silicon oxide (SiOx), silicon oxynitride (SiON), aluminum oxide (AlxOy) or the like, but they are not limited thereto. For example, the organic encapsulation layer 152 may be formed of a transparent resin selected from an acrylic resin, an epoxy resin, a polyethylene resin, or the like, but is not limited thereto.

If necessary, a color filter substrate may be selectively disposed on the encapsulation layer 150. The color filter substrate includes a color filter layer and a black matrix. The color filter layer includes a plurality of color filters overlapping each of the plurality of sub-pixel areas SPA1 and SPA2. The black matrix distinguishes a plurality of color filters and prevents color mixing between the adjacent sub-pixels. To maintain the transmittance of the transmissive area TA high, the color filter layer and the black matrix are not formed in the transmissive area TA.

The organic light emitting display device 100 according to an exemplary embodiment of the present disclosure includes the plurality of sub-pixel areas SPA2 and the plurality of transmissive areas TA in the second display area DA2. The second portion 110b of the plastic substrate 110 corresponding to the second display area DA2 includes polyimide and a ligand compound, and exhibits low yellow index and high light transmittance characteristics due to the ligand compound. Accordingly, while an image can be displayed through the second display area DA2, there is an effect of excellent light transmittance.

Accordingly, the camera module 160 may be disposed on the rear surface of the plastic substrate 110 corresponding to the second portion 110b having high light transmittance. Although the camera module 160 is disposed on the rear surface of the plastic substrate 110, since the transmittance of the second display area DA2 is high, an image of an object or the like can be captured. For convenience of description, it is exemplified that the camera module is disposed by way of example, but the present disclosure is not limited thereto. In addition to the camera module 160, various sensors may be disposed. These sensors may also detect a surrounding situation even though they are disposed on the rear surface of the plastic substrate 110 corresponding to the second portion 110b.

Figure 8:
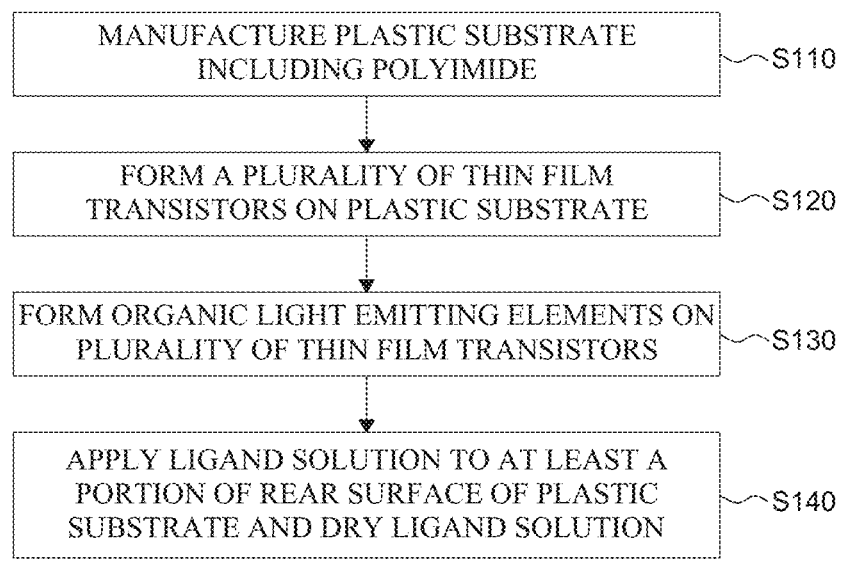
FIG. 8 is a process flowchart illustrating a manufacturing method of the organic light emitting display device according to an exemplary embodiment of the present disclosure.

Hereinafter, a manufacturing method of the organic light emitting display device will be described with reference to FIG. 8. FIG. 8 is a process flowchart illustrating a manufacturing method of the organic light emitting display device according to an exemplary embodiment of the present disclosure. With reference to FIG. 8, the manufacturing method of an organic light emitting display device according to an exemplary embodiment of the present disclosure includes manufacturing a plastic substrate including polyimide in step S110, forming a plurality of thin film transistors on the plastic substrate in step S120, forming organic light emitting elements on the plurality of thin film transistors in step S130, and applying a ligand solution to at least a portion of a rear surface of the plastic substrate and drying the ligand solution in step S140. The manufacturing method according to an exemplary embodiment of the present disclosure relates to a manufacturing method of the organic light emitting display device 100 shown in FIGS. 1 to 6, and thus, descriptions overlapping those described with reference to FIGS. 1 to 6 will be omitted.

First, a plastic substrate including polyimide is manufactured in step S110.

A polyimide precursor solution is film-formed on a carrier substrate and subjected to an imidization reaction to thereby manufacture the plastic substrate 110 including polyimide. The polyimide precursor solution may be a polyamic acid solution. Polyimide has very low solubility because penetration of a solvent thereinto is difficult due to the formation of a charge transfer complex between chains. Accordingly, polyamic acid having a higher solubility than polyimide is prepared and subjected to the imidization reaction to thereby prepare the polyimide in a film form. Polyamic acid may be synthesized by polymerizing diamine and dicarboxylic anhydride.

For example, the polyamic acid may include a repeating unit represented by the following Chemical Formula 4, but is not limited thereto.

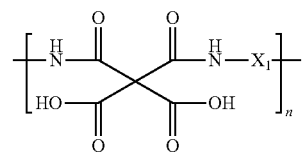

[Formula 4]

wherein

$X_1$ and $n$ are as defined in Formula 1 above.

The polyamic acid prepared as described above is dissolved in a solvent to thereby prepare a polyimide precursor solution. For example, the solvent may be selected from sulfoxide-based solvents such as dimethyl sulfoxide, diethyl sulfoxide and the like, pyrrolidone-based solvents such as N-methyl-2-pyrrolidone, N-vinyl-2-pyrrolidone and the like, formamide-based solvents such as N,N-dimethylformamide, N,N-diethylformamide and the like, acetamide-based solvents such as N,N-dimethylacetamide, N,N-diethylacetamide and the like, phenolic solvents such as phenol, o-cresol, m-cresol, p-cresol and the like, tetrahydrofuran, and the like, but is not limited thereto.

The polyimide precursor solution is film-formed on the carrier substrate and then, subjected to heat treatment to thereby imidize the polyamic acid. For example, the heat treatment may be performed within a temperature range of 200° C. to 400° C. The polyimide prepared as described above may include a repeating unit represented by Chemical Formula 1.

Next, a plurality of thin film transistors are formed on the plastic substrate in step S120.

Before forming the plurality of thin film transistors TFT, the barrier layer 121 and the auxiliary substrate layer 122 may be formed on the plastic substrate 110. The barrier layer 121 may be formed by depositing an inorganic material such as silicon nitride (SiNx), silicon oxide (SiOx), silicon oxynitride (SiON), aluminum oxide (AlxOy), or amorphous silicon (α-Si). For example, the barrier layer 121 may be formed through a known deposition method such as chemical vapor deposition, e-beam evaporation, atomic layer deposition or the like, but is limited thereto.

The auxiliary base layer 122 may be formed by including film-forming the polyimide precursor solution on the entire surface of the barrier layer 121, subjecting the polyimide precursor solution to the imidization reaction to form a polyimide film, and etching the polyimide film. For convenience of description, it is exemplified that the auxiliary base layer 122 is formed of polyimide as an example, but the present disclosure is not limited thereto.

As described with reference to FIGS. 1 to 6, the auxiliary base layer 122 is formed on the barrier layer 121 to correspond to the plurality of sub-pixel areas SPA1 and SPA2. Accordingly, after a polyimide film is formed on the entire surface of the barrier layer 121, the polyimide film in a portion excluding the plurality of sub-pixel areas SPA1 and SPA2, e.g., the polyimide film in the transmissive areas TA, is removed by etching. For example, the etching may be performed by a plasma etching method, but is not limited thereto.

In addition, the method may further include forming a buffer layer on the auxiliary base layer. The buffer layer 131 may be formed to correspond to the entire surface of the plastic substrate 110, and may be partially formed to correspond to the plurality of sub-pixel areas SPA1 and SPA2 if necessary.

The thin film transistor TFT is formed on the buffer layer 131. For example, the thin film transistor TFT is formed by including forming the active layer ACT on the buffer layer 131, forming the gate insulating layer 133 on the active layer ACT, forming the gate electrode G on the gate insulating layer 133, forming the interlayer insulating layer 132 on the gate electrode G, and forming the source electrode S and the drain electrode D on the interlayer insulating layer 132. However, the present disclosure is not limited thereto and may be formed by various methods known in the art according to a configuration and structure of the organic light emitting display device.

After forming the thin film transistor TFT, the method may include forming the planarization layer 134 to protect the thin film transistor TFT and planarize the upper portion thereof. In addition, after forming the planarization layer 134, a contact hole is formed to electrically connect the thin film transistor TFT and the organic light emitting element 140.

Next, the organic light emitting elements are formed on the plurality of thin film transistors in step S130.

The organic light emitting element 140 may be formed by including forming the anode 141 on the planarization layer 134, forming the organic light emitting layer 142 on the anode 141, and forming the cathode 143 on the organic light emitting layer 142.

As described above, the anodes 141 are formed to be separated from each other in the plurality of sub-pixels. The anode 141 may be formed by depositing a transparent conductive material by a known deposition method, such as sputtering or vapor deposition in a state in which a mask such as a fine metal mask is disposed.

After forming the anodes 141, the method may include forming the bank 135 on the anode 141 and the planarization layer 134. For example, the bank 135 may be formed of a transparent insulating resin, and may be patterned to have the first open portion OA1 and the second open portion OA2 using a photolithography method.

For example, the organic light emitting layer 142 may be formed by depositing an organic light emitting material emitting light of a color corresponding to each of the sub-pixel areas SPA1 and SPA2 using a fine metal mask. As another example, the organic light emitting layer 142 may be formed by dripping ink of a color corresponding to each of the sub-pixel areas SPA1 and SPA2 using an inkjet method and then, curing the ink.

For example, the cathode 143 may be formed by disposing a mask on the organic light emitting layer 142 and then, depositing a metallic material such as aluminum or the like by a method known in the art, such as sputtering, vapor deposition, or atomic layer unit deposition.

After forming the organic light emitting elements 140, the method may include forming the encapsulation layer 150 to protect the organic light emitting elements 140 and planarize the upper portions thereof.

Next, a ligand solution is applied to at least a portion of the rear surface of the plastic substrate 110 and dried in step S140.

First, a ligand solution is prepared. The ligand solution may be prepared by dissolving a ligand compound in a solvent. As described above, as the ligand compound, a compound having a light transmittance of 90% or more in a wavelength band of 400 nm to 500 nm may be used. The polyimide constituting the plastic substrate 110 absorbs visible light in the wavelength range of 400 nm to 500 nm due to formation of a charge transfer complex, thereby leading to a reduction in transmittance, and the ligand compound serves to inhibit the formation of the charge transfer complex to thereby improve transmittance. Therefore, to improve effects of the present disclosure, a ligand compound that does not absorb light in the wavelength range of 400 nm to 500 nm may be used.

As the solvent, a solvent capable of dissolving the ligand compound and swelling the polyimide may be used. A detailed description thereof will be provided later. For example, the solvent may be selected from sulfoxide-based solvents such as dimethyl sulfoxide, diethyl sulfoxide and the like, pyrrolidone-based solvents such as N-methyl-2-pyrrolidone, N-vinyl-2-pyrrolidone and the like, formamide-based solvents such as N,N-dimethylformamide, N,N-diethylformamide and the like, acetamide-based solvents such as N,N-dimethylacetamide, N,N-diethylacetamide and the like, phenolic solvents such as phenol, o-cresol, m-cresol, p-cresol and the like, tetrahydrofuran, and the like, but is not limited thereto.

After preparing the ligand solution, the rear surface of the flexible substrate 110 is directed upwardly, and the ligand solution is applied to at least a partial area thereof that requires relatively high transmittance. The ligand solution may be selectively applied without limitation as long as the area is an area in which high transmittance should be secured. Thus, the ligand solution may be selectively applied to a specific area of the rear surface of the flexible substrate 110 or may be applied to the entire area thereof. Transmittance of the specific area to which the ligand solution is applied is improved. Accordingly, a camera module or the like may be disposed on the rear surface of the plastic substrate having improved transmittance. In addition, when the ligand solution is applied to the entire area, transmittance of the entire area of the plastic substrate is improved, and a transparent organic light emitting display device can be manufactured without using expensive transparent polyimide.

For example, the organic light emitting display device 100 may include the first display area DA1 and the second display area DA2 having a lower resolution than the first display area DA1. The second display area DA2 may be an area in which a transmittance of a predetermined level or higher is required so that a camera module is disposed on the rear surface of the plastic substrate 100. Accordingly, the ligand solution is applied to the rear surface of the plastic substrate 110 corresponding to the second display area DA2 of the organic light emitting display device 100.

For example, the ligand solution may be applied to a specific area by a dripping method using an inkjet device, but is not limited thereto.

When the ligand solution is applied to the rear surface of the plastic substrate 110 corresponding to the second display area DA2, the solvent is diffused between the chains of the polyimide and the polyimide swells. With the diffusion of the solvent, the ligand compound penetrates between the polyimide chains, so that a distance between the polyimide chains increase. Accordingly, a solvent capable of swelling the polyimide, for example, partially dissolving the polyimide, may be used as the solvent used for preparing the ligand solution.

After the ligand solution is applied to a specific area of the plastic substrate 110 and dried, the solvent is volatilized, and the ligand compound remains between the chains of the polyimide and inhibits the formation of the charge transfer complex. As the formation of the charge transfer complex is inhibited, the plastic substrate 110 in the area to which the ligand solution is applied has a lower yellow index and higher light transmittance compared to an area in which the ligand solution is not applied. In this step, the plastic substrate 110 integrally formed by including the same polyimide is divided into the first portion 110*a* and the second portion 110*b*. The first portion 110*a* is an area that is not treated with the ligand solution and corresponds to the first display area DA1. The second portion 110*b* includes the ligand compound by being treated with the ligand solution, and corresponds to the second display area DA2.

As described above, in the manufacturing method of the organic light emitting display device according to an exemplary embodiment of the present disclosure, the transmittance of the plastic substrate including polyimide can be partially improved without using expensive equipment, such as a laser device. Accordingly, limitations of the laser irradiation method described above can be solved, and a process cost by not using expensive equipment can be reduced. In addition, even when colored polyimide is used, the transmittance can be partially increased through a ligand solution treatment process. Accordingly, equivalent effects can be achieved while significantly reducing a material cost as compared to the case of using an expensive transparent polyimide.

Next, the method may include disposing the camera module 160 to correspond to the area in which the transmittance is partially improved, such as the second portion 110*b* of the plastic substrate 110.

As described above, as light transmittance is improved in a specific area, even if the camera module 160 is disposed on the rear surface of the plastic substrate 110, an image may be smoothly captured. In addition, various sensors may be disposed instead of the camera module 160, and if necessary, a camera module and sensors may be simultaneously disposed to correspond to the second portion 110*b*.

Furthermore, in the applying and drying of the ligand solution, by applying the ligand solution to an entire rear surface of the plastic substrate, light transmittance of the entire area may be improved. In this case, light transmittance of the entire area of the organic light emitting display device is improved so that a transparent organic light emitting display device can be easily implemented.

The exemplary embodiments of the present disclosure can also be described as follows:

According to an aspect of the present disclosure, an organic light emitting display device includes a first display area including a plurality of sub-pixel areas and a second display area including a plurality of sub-pixel areas and a plurality of transmissive areas. The organic light emitting display device includes a plastic substrate including a first portion corresponding to the first display area and a second portion corresponding to the second display area, a plurality of thin film transistors disposed on the plastic substrate to correspond to the plurality of sub-pixel areas, and a plurality of organic light emitting elements disposed on the plurality of thin film transistors to correspond to the plurality of sub-pixel areas, wherein the first portion includes polyimide, and the second portion includes the polyimide and a ligand compound.

According to another aspect of the present disclosure, an organic light emitting display device, including a first display area having a plurality of sub-pixel areas therein and a second display area having a plurality of sub-pixel areas and a plurality of transmissive areas therein, comprises a plastic substrate including a first portion corresponding to the first display area and a second portion corresponding to the second display area; a plurality of thin film transistors on the plastic substrate to correspond to the plurality of sub-pixel areas; and a plurality of organic light emitting elements on the plurality of thin film transistors to correspond to the plurality of sub-pixel areas, wherein the second portion includes polyimide and a ligand compound, and the first portion includes polyimide with the ligand compound absent therein.

The first portion and the second portion may be integrally formed by including the polyimide.

A yellow index of the second portion may be lower than a yellow index of the first portion, and light transmittance of the second portion at 400 nm to 500 nm may be greater than light transmittance of the first portion at 400 nm to 500 nm.

A light transmittance (450 nm) of the first portion may be 40% or less, and a light transmittance (450 nm) of the second portion may be 50% or more.

The ligand compound may have a light transmittance of 90% or more in a wavelength range of 400 nm to 500 nm.

The ligand compound may include at least one selected from an amine-based compound and a carboxylic acid-based compound.

The amine-based compound may be an amine having an alkyl group having 3 to 20 carbon atoms, and the carboxylic acid compound may be a carboxylic acid having an alkyl group having 3 to 20 carbon atoms.

A resolution of the second display area may be lower than a resolution of the first display area.

The organic light emitting display device may further include a planarization layer between the plurality of thin film transistors and the plurality of organic light emitting elements to planarize upper portions of the plurality of thin film transistors, wherein the planarization layer may be in direct contact with the plastic substrate in the transmissive areas.

The organic light emitting display device may further include a barrier layer between the plastic substrate and the plurality of thin film transistors, and an auxiliary base layer on the barrier layer to correspond to the plurality of sub-pixel areas.

The organic light emitting display device may further include a planarization layer between the plurality of thin film transistors and the plurality of organic light emitting elements to planarize the upper portions of the plurality of thin film transistors, wherein the planarization layer may be in direct contact with the barrier layer in the transmissive areas.

The organic light emitting display device may further include a bank on the planarization layer and including a plurality of open portions exposing at least portions of the planarization layer, wherein the bank may include at least one first open portion overlapping at least a portion of each of the sub-pixel areas and at least one second open portion that is formed to overlap at least a portion of each of the transmissive areas, and wherein each of the plurality of organic light emitting elements may be on the planarization layer exposed by the first open portion.

The organic light emitting display device may further include an encapsulation layer on the bank and the plurality of organic light emitting elements to planarize upper surfaces of the plurality of organic light emitting elements.

The encapsulation layer may be in direct contact with the planarization layer in the transmissive areas.

At least one of a camera module and a sensor may be on a rear surface of the plastic substrate corresponding to the second portion.

According to another aspect of the present disclosure, a manufacturing method of an organic light emitting display device includes manufacturing a plastic substrate including polyimide, forming a plurality of thin film transistors on the plastic substrate, forming organic light emitting elements on the plurality of thin film transistors, and applying a ligand solution to at least a portion of a rear surface of the plastic substrate and drying the ligand solution.

According to another aspect of the present disclosure, a manufacturing method of an organic light emitting display device comprises providing a plastic substrate including polyimide; forming a plurality of thin film transistors on the plastic substrate; forming organic light emitting elements on the plurality of thin film transistors; and applying a ligand solution to at least a portion of a rear surface of the plastic substrate and drying the ligand solution.

The ligand solution may include a ligand compound having a light transmittance of 90% or more in a wavelength range of 400 nm to 500 nm and a solvent.

In the applying and drying of the ligand solution, the ligand compound may penetrate between polymer chains of the polyimide, so that a yellow index decreases and light transmittance increases in at least a partial area of the plastic substrate.

The ligand compound may include at least one selected from an amine-based compound and a carboxylic acid-based compound.

The organic light emitting display device may include a first display area and a second display area having a lower resolution than that of the first display area, wherein in the applying and drying of the ligand solution, the ligand solution may be applied to a rear surface of the plastic substrate corresponding to the second display area.

It will be apparent to those skilled in the art that various modifications and variations can be made in the organic light emitting display device and the manufacturing method thereof of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device including a first display area having a plurality of sub-pixel areas therein and a second display area having a plurality of sub-pixel areas and a plurality of transmissive areas therein, the organic light emitting display device comprising:
   a plastic substrate including a first portion corresponding to the first display area and a second portion corresponding to the second display area;
   a plurality of thin film transistors on the plastic substrate to correspond to the plurality of sub-pixel areas of the first and second display areas; and
   a plurality of organic light emitting elements on the plurality of thin film transistors to correspond to the plurality of sub-pixel areas of the first and second display areas,
   wherein the second portion includes polyimide and a ligand compound, and the first portion includes polyimide with the ligand compound absent therein.

2. The organic light emitting display device of claim 1, wherein the first portion and the second portion are integrally formed by including the polyimide.

3. The organic light emitting display device of claim 1, wherein a yellow index of the second portion is lower than a yellow index of the first portion, and a light transmittance of the second portion at 400 nm to 500 nm is greater than light transmittance of the first portion at 400 nm to 500 nm.

4. The organic light emitting display device of claim 1, wherein a light transmittance (450 nm) of the first portion is 40% or less, and a light transmittance (450 nm) of the second portion is 50% or more.

5. The organic light emitting display device of claim 1, wherein the ligand compound has a light transmittance of 90% or more in a wavelength range of 400 nm to 500 nm.

6. The organic light emitting display device of claim 1, wherein the ligand compound includes at least one selected from an amine-based compound and a carboxylic acid-based compound.

7. The organic light emitting display device of claim 6, wherein the amine-based compound is an amine having an alkyl group having 3 to 20 carbon atoms, and the carboxylic acid-based compound is a carboxylic acid having an alkyl group having 3 to 20 carbon atoms.

8. The organic light emitting display device of claim 1, wherein a resolution of the second display area is lower than a resolution of the first display area.

9. The organic light emitting display device of claim 8, further comprising a planarization layer between the plurality of thin film transistors and the plurality of organic light emitting elements to planarize upper portions of the plurality of thin film transistors.

10. The organic light emitting display device of claim 9, further comprising:
    a barrier layer between the plastic substrate and the plurality of thin film transistors; and
    an auxiliary base layer on the barrier layer to correspond to the plurality of sub-pixel areas of the first and second display areas.

11. The organic light emitting display device of claim 10, further comprising a planarization layer between the plurality of thin film transistors and the plurality of organic light emitting elements to planarize the upper portions of the plurality of thin film transistors,
    wherein the planarization layer is in direct contact with the barrier layer in the transmissive areas.

12. The organic light emitting display device of claim 11, further comprising a bank on the planarization layer and including a plurality of open portions exposing at least portions of the planarization layer,
    wherein the plurality of open portions includes at least one first open portion overlapping at least a portion of the sub-pixel areas of the first and second display areas and at least one second open portion overlapping at least a portion of the transmissive areas, and
    wherein each of the plurality of organic light emitting elements is on the planarization layer exposed by the first open portion.

13. The organic light emitting display device of claim 12, further comprising an encapsulation layer on the bank and the plurality of organic light emitting elements to planarize upper surfaces of the plurality of organic light emitting elements.

14. The organic light emitting display device of claim 13, wherein the encapsulation layer is in direct contact with the planarization layer in the transmissive areas.

15. The organic light emitting display device of claim 1, wherein at least one of a camera module and a sensor is on a rear surface of the plastic substrate corresponding to the second portion.

16. A manufacturing method of an organic light emitting display device, the manufacturing method comprising:
- providing a plastic substrate including polyimide;
- forming a plurality of thin film transistors on the plastic substrate;
- forming organic light emitting elements on the plurality of thin film transistors; and
- applying a ligand solution to at least a portion of a rear surface of the plastic substrate and drying the ligand solution.

17. The manufacturing method of claim 16, wherein the ligand solution includes a ligand compound having a light transmittance of 90% or more in a wavelength range of 400 nm to 500 nm and a solvent.

18. The manufacturing method of claim 17, wherein in the applying and drying of the ligand solution, the ligand compound penetrates between polymer chains of the polyimide so that a yellow index decreases and light transmittance increases in at least a partial area of the plastic substrate.

19. The manufacturing method of claim 17, wherein the ligand compound includes at least one selected from an amine-based compound and a carboxylic acid-based compound.

20. The manufacturing method of claim 17, wherein the organic light emitting display device includes a first display area and a second display area having a lower resolution than that of the first display area,
- wherein in the applying and drying of the ligand solution, the ligand solution is applied to a rear surface of the plastic substrate corresponding to the second display area.

* * * * *